(12) United States Patent
Logunov et al.

(10) Patent No.: US 8,257,603 B2
(45) Date of Patent: Sep. 4, 2012

(54) LASER PATTERNING OF GLASS BODIES

(75) Inventors: Stephan Lvovich Logunov, Corning, NY (US); Joseph Francis Schroeder, III, Corning, NY (US)

(73) Assignee: Corning Incorporated, Corning, NY (US)

( * ) Notice: Subject to any disclaimer, the term of this patent is extended or adjusted under 35 U.S.C. 154(b) by 632 days.

(21) Appl. No.: 12/480,933

(22) Filed: Jun. 9, 2009

(65) Prior Publication Data

US 2010/0050692 A1    Mar. 4, 2010

Related U.S. Application Data

(60) Provisional application No. 61/190,489, filed on Aug. 29, 2008.

(51) Int. Cl.
*B44C 1/22* (2006.01)
*B23K 26/00* (2006.01)

(52) U.S. Cl. ............... 216/65; 216/31; 216/62; 216/87; 219/121.69; 219/121.71

(58) Field of Classification Search .............. 216/31, 216/62, 65, 87; 219/121.69, 121.71
See application file for complete search history.

(56) References Cited

U.S. PATENT DOCUMENTS

| | | | | |
|---|---|---|---|---|
| 4,478,677 A | * | 10/1984 | Chen et al. | 216/65 |
| 5,747,396 A | | 5/1998 | Miyakoshi et al. | 501/32 |
| 6,617,541 B1 | * | 9/2003 | Wadman et al. | 219/121.69 |
| 6,990,285 B2 | | 1/2006 | Schroeder et al. | 385/137 |
| 2002/0035852 A1 | | 3/2002 | Wang et al. | 65/34 |
| 2003/0007772 A1 | * | 1/2003 | Borrelli et al. | 385/137 |
| 2003/0203205 A1 | | 10/2003 | Bi et al. | 428/402 |
| 2003/0209040 A1 | * | 11/2003 | Hashimoto et al. | 65/441 |
| 2003/0217809 A1 | * | 11/2003 | Morishige | 156/345.5 |
| 2007/0262464 A1 | * | 11/2007 | Watkins et al. | 257/774 |
| 2010/0186449 A1 | * | 7/2010 | Aitken et al. | 65/34 |

FOREIGN PATENT DOCUMENTS

| | | |
|---|---|---|
| JP | 10-74583 | 3/1998 |
| JP | 11-97169 | 4/1999 |

* cited by examiner

*Primary Examiner* — Shamim Ahmed
(74) *Attorney, Agent, or Firm* — Svetlana Z. Short

(57) ABSTRACT

Methods are provided for laser patterning a partial depth surface portion of a glass body by controlling the amount of stress induced in the glass body. A laser beam is directed along an impinged path on the surface portion of the glass body to heat the glass body to form a swell. The glass body is then cooled and etched. The surface portion of the glass body is heated above the strain point at a heating rate HR to form a swell. The heating rate HR is a function of a target temperature T and an exposure time of the output laser beam. The exposure time is controlled to reach a target temperature above the softening point of the glass body and does not require a power density that would lead to laser ablation of the surface portion. The surface portion is cooled below the strain point to induce regions of localized stress. The unablated surface portion is etched while in a state of laser-induced localized stress to form a patterned glass body.

16 Claims, 12 Drawing Sheets

LASER PATTERNING OF GLASS BODIES

This application claims the benefit of U.S. Provisional Application No. 61/190,489 filed Aug. 29, 2008, entitled "Laser Patterning of Glass Bodies".

FIELD OF THE INVENTION

The present invention relates generally to method laser patterning of glasses and, more specifically of micromachining glasses using laser induced stress.

TECHNICAL BACKGROUND

It is known that glass bodies can be micromachined using particular pulsed lasers. In a laser micromachining process, laser energy is directed into a material and a portion of the irradiated material is removed by ablation. Laser micromachining can be used, for example, to drill, cut, and scribe glass so as to form structures including, for example, channels, grooves, or holes in the glass material.

In some micromachining processes, the laser energy comprises one or more laser pulses. However, when more than a single laser pulse is used, residual heat can accumulate in the bulk of the remaining material as successive pulses are incident upon the material. If the laser pulse repetition rate is sufficiently high, the accumulated heating can become severe enough to cause undesirable effects, such as melting, or other changes to the surrounding regions of the glass material. These regions are known as Heat Affected Zones (HAZ), and they lead to imprecision in the micromachining process.

In some pulsed laser micromachining processes, a higher laser pulse repetition rate is necessary to make the micromachining process economically feasible. One micromachining approach utilizes formation of microcracks created by the high repetition lasers, followed by the etching of the microcracked areas. However, the microcracks may propagate into the surrounding area, which would lead to imprecision in the micromachining process. Another approach is to use a high repetition femtosecond laser with water or other liquid in contact with the glass, to clean out the removed glass as damaged regions are created.

Yet another approach utilizes lithographical etching of the glass. In this approach the photoresist material is deposited on top of the treated material. The photoresist is exposed with UV radiation and cured. Uncured photoresist can be removed, and whole part is exposed to acid. Only material without photoresist on the top will be etched. After etching remaining photoresist can be removed. There are different modifications of this approach, but all of them use photoresist and UV exposure to create desired pattern. The laser is used to expose and/or cure the photo resist material, not to change the glass.

Accordingly, apparatus and methods are needed that enable a more efficient and simple, or more exact way of laser micromachining.

SUMMARY OF THE INVENTION

One aspect of the invention is a method for laser patterning of a glass body, the method comprising the steps of:
(i) providing a laser, said laser having an output beam at a laser wavelength $\lambda$;
(ii) providing a glass body having optical density at of at least 1.5/cm at said wavelength $\lambda$;
(iii) directing said laser output beam to (a) impinge on the glass body without ablating said glass, and (b) heat the glass body at a location proximate to said laser output beam so as to form a swell at this location; and
(iv) etching this location.

In at least some of the embodiments, the laser treated area has preferential (i.e., faster) rate of etching than the surrounding areas.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

BRIEF DESCRIPTION OF THE DRAWINGS

FIG. 6 illustrates that both in this glass body both the front surface and the rear surface have been etched.

DETAILED DESCRIPTION OF THE PREFERRED EMBODIMENTS

Figure 1:
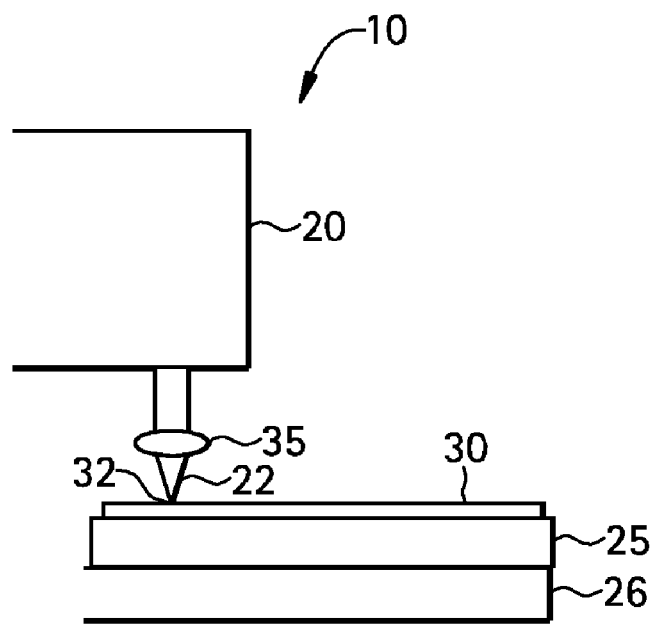
FIG. 1 is a schematic of a laser micromachining system according to one embodiment of the present invention.

Reference will now be made in detail to the present preferred embodiment(s) of the invention, examples of which are illustrated in the accompanying drawings. Whenever possible, the same reference numerals will be used throughout the drawings to refer to the same or like parts. One embodiment of the laser micromachining system of the present invention is shown in FIG. 1, and is designated generally throughout by the reference numeral 10. The laser micromachining system includes a laser 20 for providing a laser output beam 22, a bed 25 for the glass body 30, and an optional translation stage 26 for the bed 25. Alternatively, an optional scanning system (not shown) can be utilized to scan the laser output beam 22 across at least the required portion of the glass body 30. The laser micromachining system includes a laser 20 may also include an optional focusing lens 35 for focusing laser output beam 22 on the glass body 30. Preferably the glass body 30 may be doped with at least one of: iron, boron, or cerium, copper, vanadium, or other transition metals having absorption coefficient equal to or higher than 2 $cm^{-1}$. Preferably the focusing lens 35 has a numerical aperture NA of equal to or less than 0.4 (i.e., NA$\leq$0.4). According to some embodiments, the laser 20 has laser wavelength $\lambda$ in a wavelength range of 266 nm to 10 microns, and repetition rate of more than 1 kHz. For example, the laser 20 may be: a continuous wave laser, quasi CW laser with repetition rate greater than 1 kHz (e.g., >10 kHz) a diode laser, an 810 nm laser, Nd:Yag laser, a $CO_2$ laser, or a single pulse laser. Preferably the laser output beam 22 is moving relative to the glass body 30 at a rate of at least 1 mm/sec, for example 1-20 mm/sec.

Figure 2:
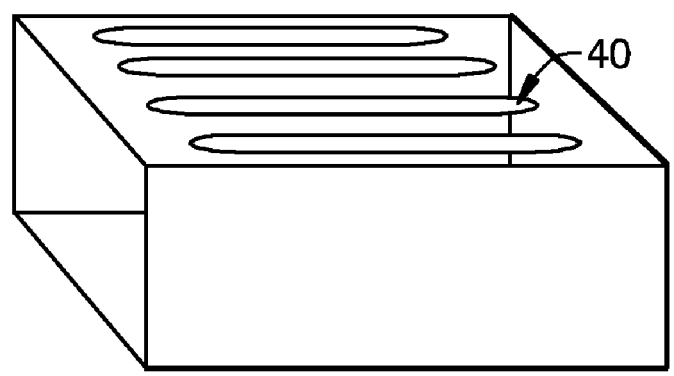
FIG. 2 is a schematic illustration showing a glass body with a swell (i.e., a swollen area) formed along a path of the laser output beam produced by a laser micromachining system shown in FIG. 1.

In accordance with some embodiments of the present invention method of laser patterning of a glass body includes the steps of (i) providing a laser 20, the laser 20 producing an output beam 22 at a laser wavelength $\lambda$ that is within the absorption band of the glass body and (ii) providing a glass body 30 having optical density of at of at least 1.5/cm, and preferably 2/cm at this wavelength $\lambda$. The laser power required to achieve the desired effect needs to be sufficiently high to bring the glass temperature above strain point (i.e., strain temperature) and preferably to or above softening temperature of the glass. (It is noted that overall higher absorption, or optical density of the glass is approximately inversely proportional to required laser power (given the same duration of the exposure and the same laser power density on the glass). The laser output beam 22 is directed to impinge on the glass body 30 without ablating glass, and to heat the glass body 30 at a location 32 proximate to the laser output beam 22 so as to form a "swell" 40 (i.e., swollen area 40, for example as a bump or a ridge) with a height h of at least 1000 A at this location. Preferably, according to some embodiments, the height of the swell 40 is at least 1 μm and less than 350 μm, for example 2 μm to 200 μm, or 3 μm to 100 μm, which will vary based on the glass compositions. For example, a laser induced swell 40 may be 10 μm to 600 μm wide and 1 μm to 30 μm tall. The formation of the swell and/or height of the swelling is an indication that glass reached at least softening temperature. If the glass body 30 is translated relative to the impinging laser output beam 22, for example by a translating bed 25, or if the laser beam is scanned across at least a portion of the glass surface, the swell 40 forms along the path of the laser output beam 22 and is longer than it is wide (see FIG. 2, for example).

Preferably, after the laser exposure (and subsequent cooling), the swell 40 has laser-induced stress birefringence (for 0.7 mm thick glass) of at least 1.6 nm, preferably at least 3.2 nm, more preferably at least 4.8 nm, more preferably at least 6.4 nm, and even more preferably between 6.4 and 282 nm. Preferably, after the laser exposure (and subsequent cooling), the resulting laser induced stress is at least 200 psi, more preferably at least 300 psi, even more preferably at least 400 psi. For example, according to some embodiments, localized laser induced stress at or adjacent to location(s) 32 may be 200 psi to 30000 psi, or 400 psi to 25000 psi, or 1000 psi to 15000 psi. It is noted that the stress also penetrates the glass below the swells 40, (i.e., the "stressed" areas have larger dimensions than the dimensions of the swells 40.)

Preferably, when the laser output beam 22 impinges on the glass at location 32, the glass at location 32 heats at a rate of 200° C./sec to 5000° C./sec (and preferably at the rate of 500° C./sec to 2500° C./), and then cools at up to 1,200,000° C./sec (and preferably at the rate of 10° C./sec to 1,000,000° C./sec). For example, in some exemplary embodiments, moving the laser output beam 22 relatively to the glass body 30, at a velocity of 2 mm/sec to 30 mm/sec resulted in heating the localized area at a rate of 200° C./sec to 5000° C./sec and, after cooling created a pattern of localized laser-induced stress of at least 6.3 nm in the glass body that was 0.7 mm thick (this pattern corresponds to swells 40).

After the swell(s) 40 is formed, the glass body 30 is placed in an acid, base, or etchant gas, and the swollen area(s) etches out faster than the surrounding area(s), forming a depression at the location 32. The depth of the etched out area is proportional to the amount of stress present in the swell(s) 40. Preferably the swell 40 (or location 32) etches out at least 5 times faster than the surrounding glass. According to some embodiments the swell 40 (or location 32) etches out at least 10 times faster than the surrounding glass. Preferably the swell 40 (or location 32) etches out at least 20 times faster than the surrounding glass. Preferably the swell(s) 40, or location(s) 32, etch out at the rate of at least 5 μm/min, for example, more preferably at the rate of 5 to 50 μm/min. In some exemplary embodiments the etch rate is, for example, 6 to 30 μm/min.

The heating rate of the glass is at least partially determined by laser power and duration of laser exposure. The typical laser exposure is 1-2 seconds. The shorter exposure time requires higher laser power and higher power densities on the glass, which potentially could lead to the glass ablation. So, at the shorter exposure limit, the heating rate is determined by the high power density leading to laser ablation. We define the heating rate HR to be: HR=T(target)/exposure time, where T(target) is target temperature. The target temperature, T(target) (i.e., temperature T when the swell 40 starts to form) needs to be above softening point of the glass, typically above 800° C.-1200° C. Preferable laser exposure duration time is greater than 50 milliseconds. Typical exemplary shortest exposure time is 0.25 sec, preferably 0.5 sec, so preferable maximum average heating rate of the glass at location(s) 32 is 5000° C./sec, more preferably 2400° C./sec. It is preferable for the heating rate to be in the range of 1000° C./sec to 5000° C./sec, more preferably, 1500° C./sec to 2400° C.°/sec. When the heating rate is too low, heat diffusion makes heat spread to a very large area, making the treated area very large. For example the heat may spread over an area wider than about 3-5 mm, leading to loss of ability to create small features on glass. In addition, a larger heating zone may lead to glass cracking, and a slower cooling rate.

The cooling rate of the glass in the previously heated area (location(s) 32) is determined by the heat diffusivity rate in the glass, and heating spot size. Typically cooling rates that were measured experimentally were found significantly higher than the heating rates. The typical cooling time is about 1-10 ms from the same peak temperature, so maximum average cooling rate is about 1200° C./1 ms, or about 120000° C./sec. This cooling rate creates a significant stress in area(s) 40 of the glass body 30 at the location(s) 32. It is preferable for the cooling rate to be in the range of 100° C./see to 120000 C/sec ° C./sec, more preferably, 15000° C./sec to 100000° C./sec. Slow cooling rates allow glass to completely relax, leading to absence of stress in the glass, which is often undesirable. (Slow cooling rates for glass are cooling rates that in the range of a few degrees per minute.) Faster cooling rates (100° C./sec to 120000 C/sec ° C./sec), especially around the glass strain point (also referred to as strain temperature herein) lead to higher stress, which is more desirable.

The cooling rate depends on temperature of the glass, because heat radiation loss is proportional to $T^4$, where T is temperature of the glass in the treated region. At high temperatures in the treated region cooling is fast, at lower temperatures the cooling is slower. The most important temperature for stress formation is strain point. (At temperatures above strain point no additional significant stress is formed.)

The parameters for absorption and laser power and power density could be determined as follows: The maximum absorption is in the range of 30 $cm^{-1}$, while minimum absorption is 1 $cm^{-1}$. The maximum absorption determines the depth of "laser treated" region, while minimum absorption assumes that all thickness of the glass (1-3 mm piece) is treated, but requires very high laser power. The treated areas of the glass body 30 (location(s) 32) need to reach temperature when glass can flow, or at least be above strain point, in order to generate adequate degree of stress in this location(s). These temperatures are glass specific, but typically strain point is about 450° C. to 800° C., while glass softening points are in the 800° C. to 1200° C. range. Therefore, laser power density, glass absorption, and exposure time needs to be such that glass at location(s) 32 reaches this temperature during laser treatment (either line or spot exposure). In a first approximation the relationship between target temperature T and other parameters may look like this: $T \approx P(\lambda)\tau^{1/2}\alpha(\lambda)/(a^{3/2}D^{1/2})$, where P is laser power, α is glass absorption, a is laser spot size, D is glass heat diffusivity (almost the same for all glasses), τ is duration of laser pulse, λ is laser wavelength. The typical size of laser spot is 0.1 to 2 mm wide. According to some embodiments, T>900-1500° C., depending on glass composition.

The desired depth of the etched region can thus be provided by choosing a glass with absorption that is appropriate to laser wavelength of the available laser(s), or by ether choosing a laser with a wavelength λ, or by adjusting laser wavelength λ to match absorption properties of the glass. A wide range of etched depths from a few um up to all thickness of glass body may be achieved.

The invention will be further clarified by the following examples.

EXAMPLE 1

In this example, the glass body 30 was irradiated with a laser 20, at four different locations, each corresponding to one of four different beam velocities. More specifically, the laser output beam 22 was moved along the top surface of the glass body at a velocity V, where V was 15 mm/sec, 10 mm/sec, 5 mm/sec and 2 mm/sec. The composition of the cerium doped glass in this example was as follows:

| | (Mol %) |
|---|---|
| SiO2 | 80.85 |
| Al2O3 | 1.21 |
| B2O3 | 12.44 |
| Na2O | 3.5 |
| CeO2 | 1 |
| TiO2 | 1 |

The following Table 1 summarizes the achieved results, which are illustrated in FIGS. 3A, 3C, 3E and 3G.

TABLE 1

| Ce-doped borosilicate glass | | | | |
|---|---|---|---|---|
| velocity V (mm/s) | 15 | 10 | 5 | 2 |
| Resulting stress (psi) | 407 | 1019 | 1630 | 4076 |
| Resulting Birefringence (nm) for 0.7 thick glass | 6.3 | 15.7 | 25.1 | 62.77 |
| swell peak h (μm) | 1.4 | 1.78 | 3 | 5.5 |

The glass body 30 was then dipped in 50% HF acid for 5 minutes. The results are summarized in Table 2 and are shown in FIGS. 3B, 3D, 3F and 3H.

TABLE 2

Figure 3A:
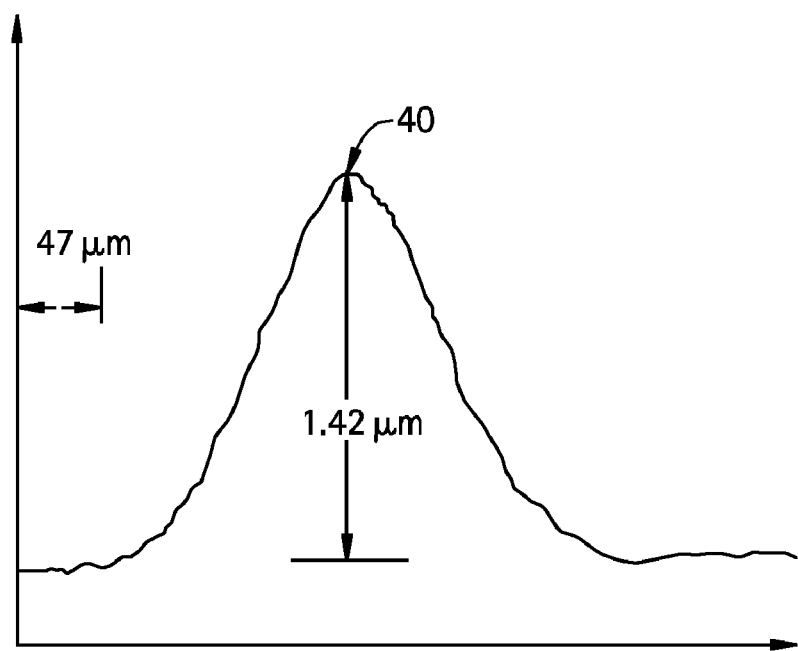
FIG. 3A is an illustration of a first exemplary cross-sectional area of laser induced swollen area in a glass body, where the laser output beam was moved along the glass body at a rate of 15 mm/sec.
Figure 3B:
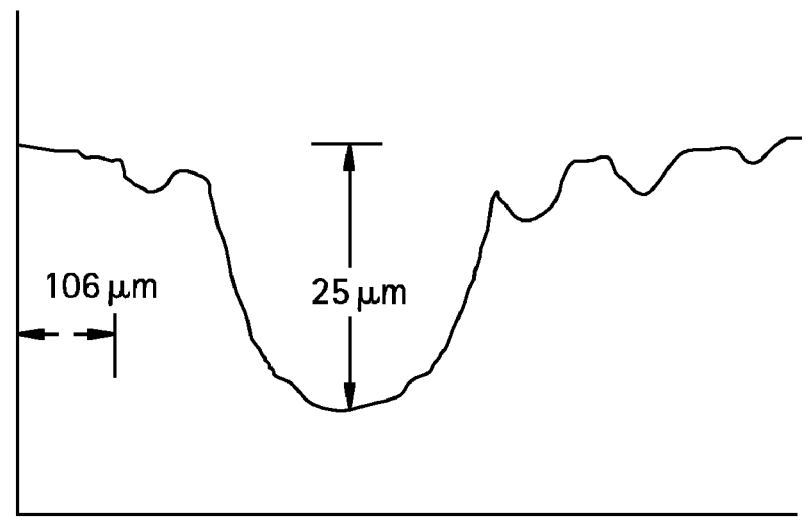
FIG. 3B illustrates cross-sectional area of a glass body, after etching the swollen area shown in FIG. 3A.
Figure 3C:
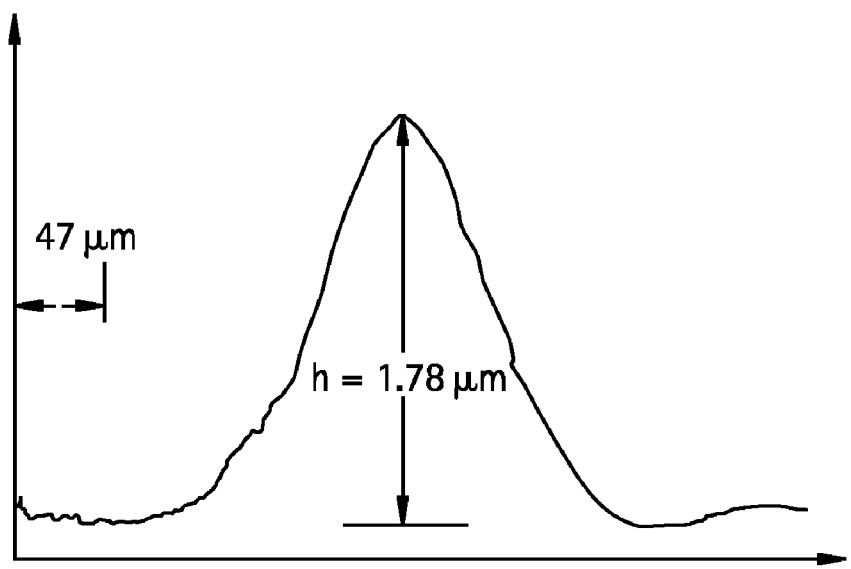
FIG. 3C is an illustration of a second exemplary cross-sectional area of laser induced swells in a glass body, where the laser output beam was moved along the glass body at a rate of 10 mm/sec.
Figure 3D:
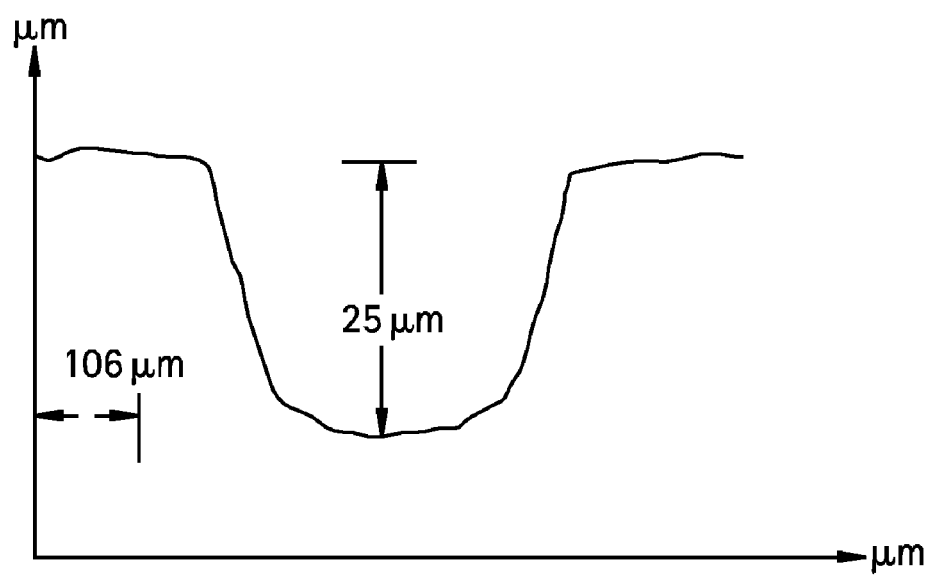
FIG. 3D illustrates cross-sectional area of a glass body, after etching the swollen area shown in FIG. 3C.
Figure 3E:
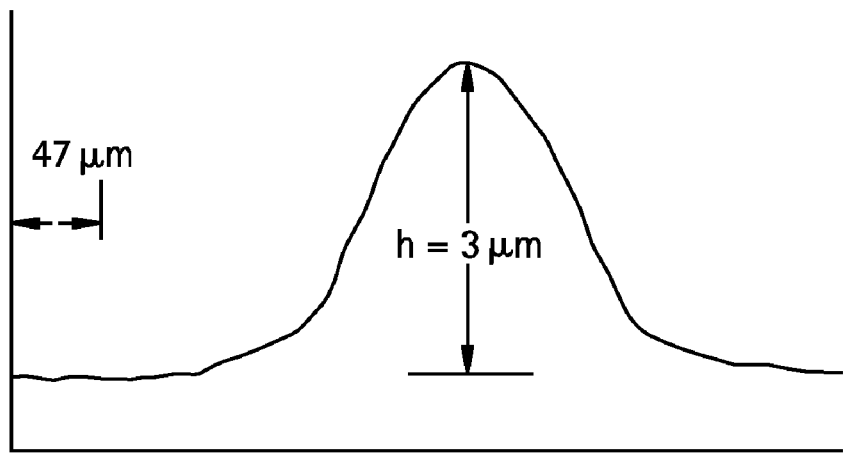
FIG. 3E is an illustration of a third exemplary cross-sectional area of laser induced swollen area in a glass body, where the laser output beam was moved along the glass body at a rate of 5 mm/sec.
Figure 3F:
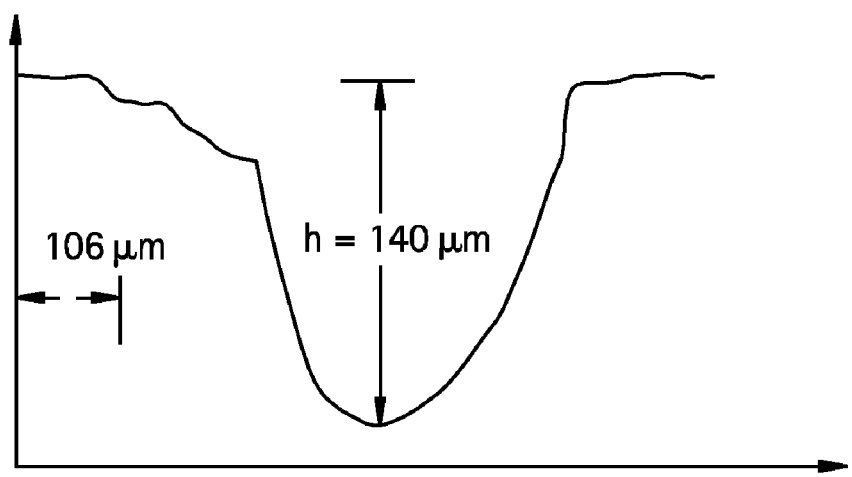
FIG. 3F illustrates cross-sectional area of a glass body, after etching the swollen are shown in FIG. 3E.
Figure 3G:
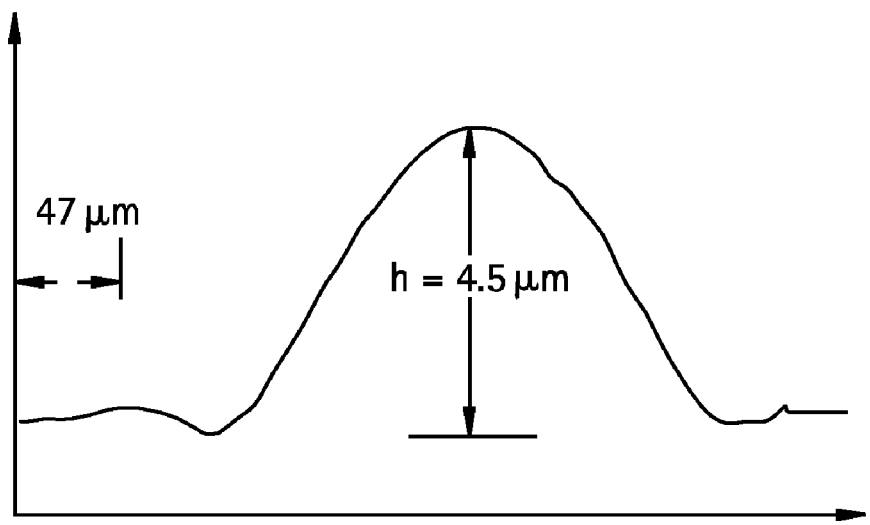
FIG. 3G is an illustration of a fourth exemplary cross-sectional area of laser induced swollen area in a glass body, where the laser output beam was moved along the glass body at a rate of 5 mm/sec.
Figure 3H:
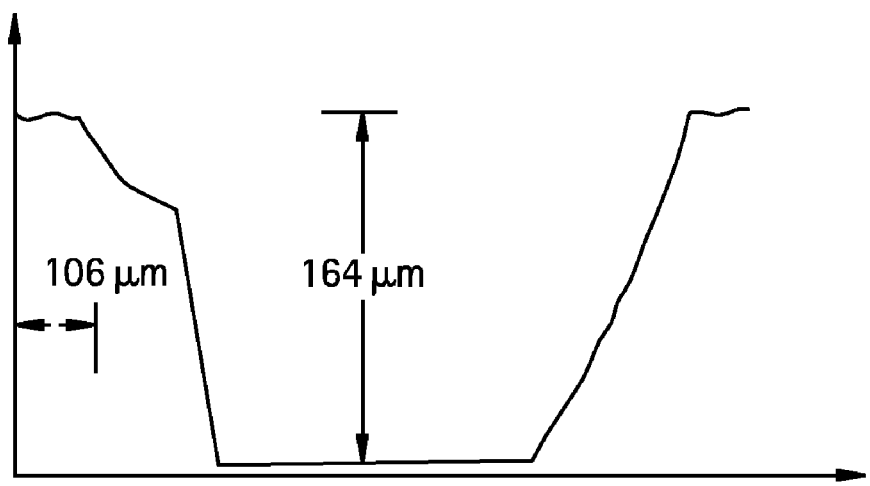
FIG. 3H illustrates cross-sectional area of a glass body, after etching the swollen are shown in FIG. 3G.

| | FIG. 3B | FIG. 3D | FIG. 3F | FIG. 3H |
|---|---|---|---|---|
| etched depth (μm) | 25 | 25 | 140 | 164 |

More specifically, FIGS. 3A, 3C, 3E and 3G are illustration of exemplary cross-sectional areas of laser induced swells 40 in a Ce doped borosilicate glass body 30, where the laser output beam 22 was moved along the glass body at a rate V, where V was 15 mm/sec, 10 mm/sec, 5 mm/sec and 2 mm/sec, respectively. The laser 20 is a NG:Yag laser, with an output laser wavelength λ of 355 nm, average laser power of 2 W, and repetition rate of 140 kHz. The laser beam spot size on the glass surface was about 200-300 μm in diameter. Because of the presence of Ce ions, this glass body has an absorption band in UV region, thus enabling the glass body to absorb energy corresponding to the 355 nm wavelength. As shown in FIGS. 3A, 3C, 3E and 3G the faster the relative motion of the laser beam across the glass surface, the lower is the height h of the swells. This difference in height h can be explained by higher power density on the glass produced by a slower moving beam (more dwell time at any given particular location), and lower power density produced by a faster moving beam (less dwell time at any given particular location). For example, the height h of the swell 40 corresponding to FIG. 3E (V=5 mm/sec) is 8 μm, while the height h of the swell 40 corresponding to FIG. 3C (V=10 mm/sec) is 3.25 μm.

FIGS. 3B, 3D, 3F, 3H illustrate cross-sectional areas of respective glass bodies, after etching in a 50% hydrofluoric acid for a period of 5 min the swells 40 that correspond, respectively, to cross-sections illustrated in FIGS. 3A, 3C, 3E and 3G. As we can see, the deeper areas correspond to lower velocities and/or the areas with higher stress (higher induced birefringence).

Figure 4A:
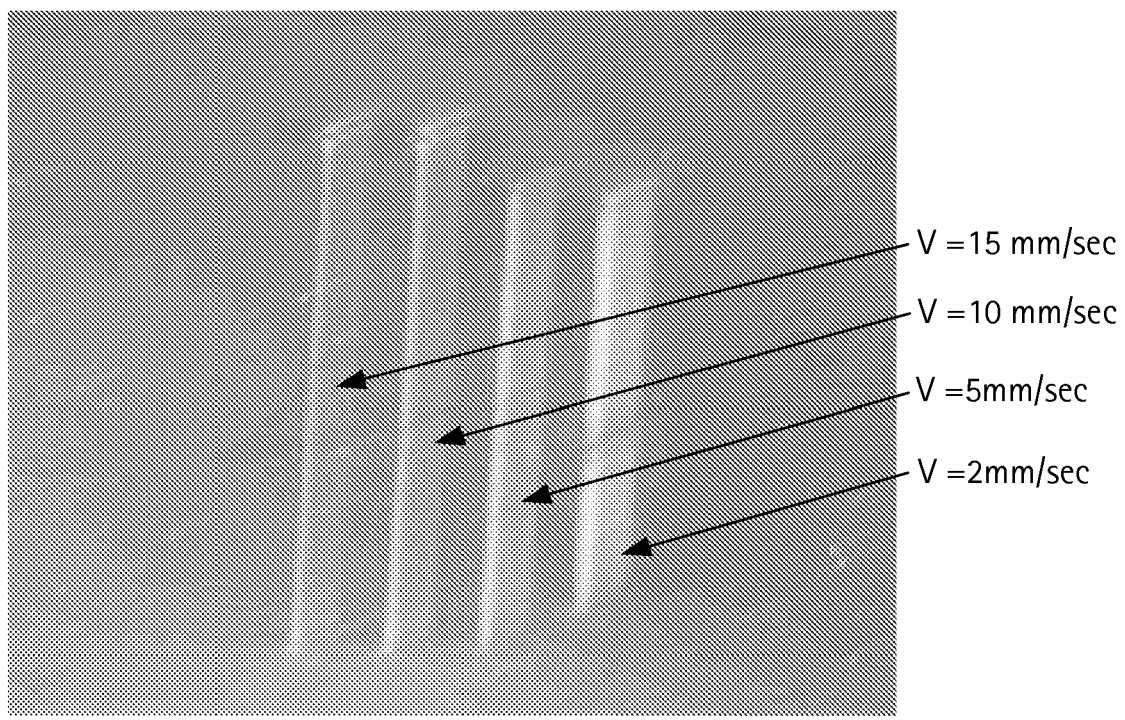
FIG. 4A illustrates the stress areas (areas of birefringence) corresponding to the laser induced swollen areas of FIGS. 3A, 3C, 3E and 3G, present in a cerium doped boro-silicate glass body situated between two crossed polarizers.

FIG. 4A illustrates the stress areas (areas of birefringence) corresponding to the laser induced swollen areas of FIGS. 3A, 3C, 3E and 3G, present in a cerium doped boro-silicate glass body situated between two crossed polarizers.

Figure 4B:
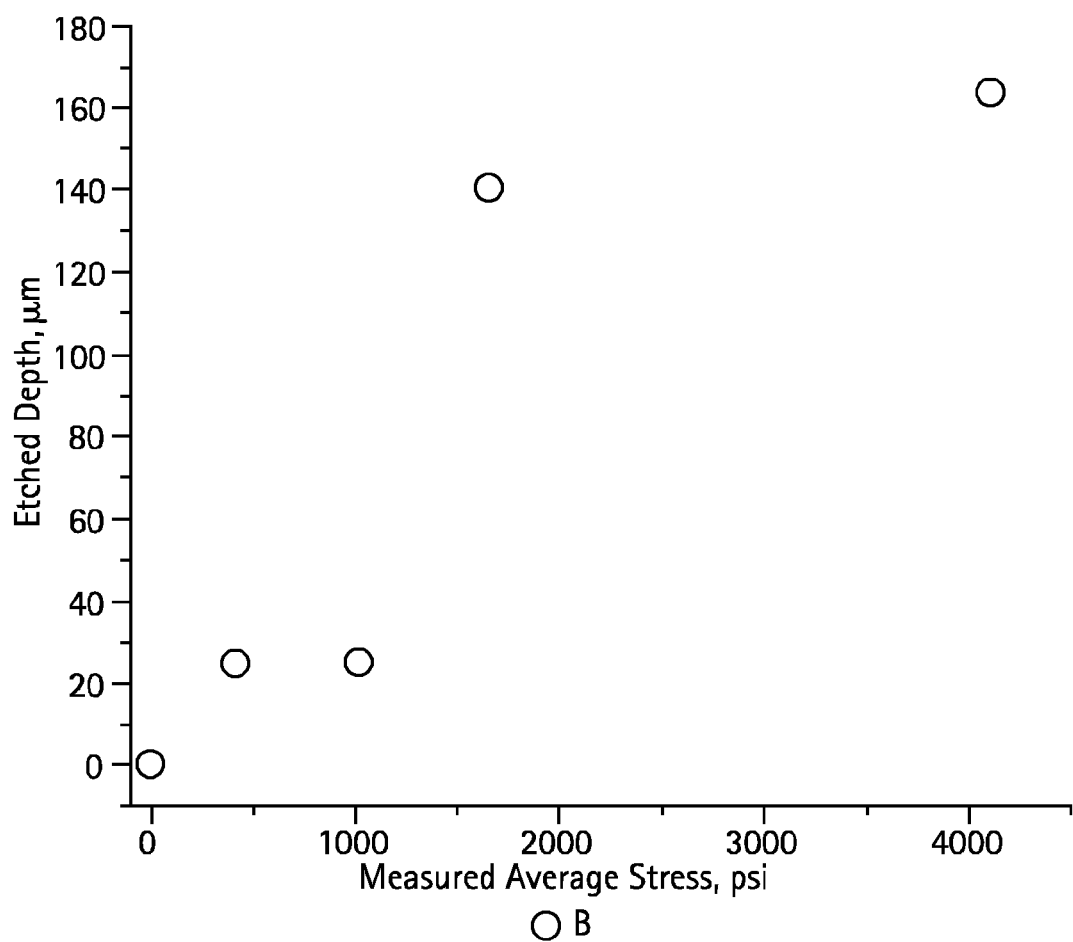
FIG. 4B illustrates relationship between etching depth and average stress (psi) in laser exposed areas of Ce doped glass.

FIG. 4B illustrates relationship between etching depth and measured average stress for Ce doped glass (after laser expose and cooling). As we can see, the relationship is almost linear. The stress in swells 40 was measured to be in 50 to 4000 psi range and the resulted etching depth for 5 min processing with acid was 20 to 160 µm.

Figure 4C:
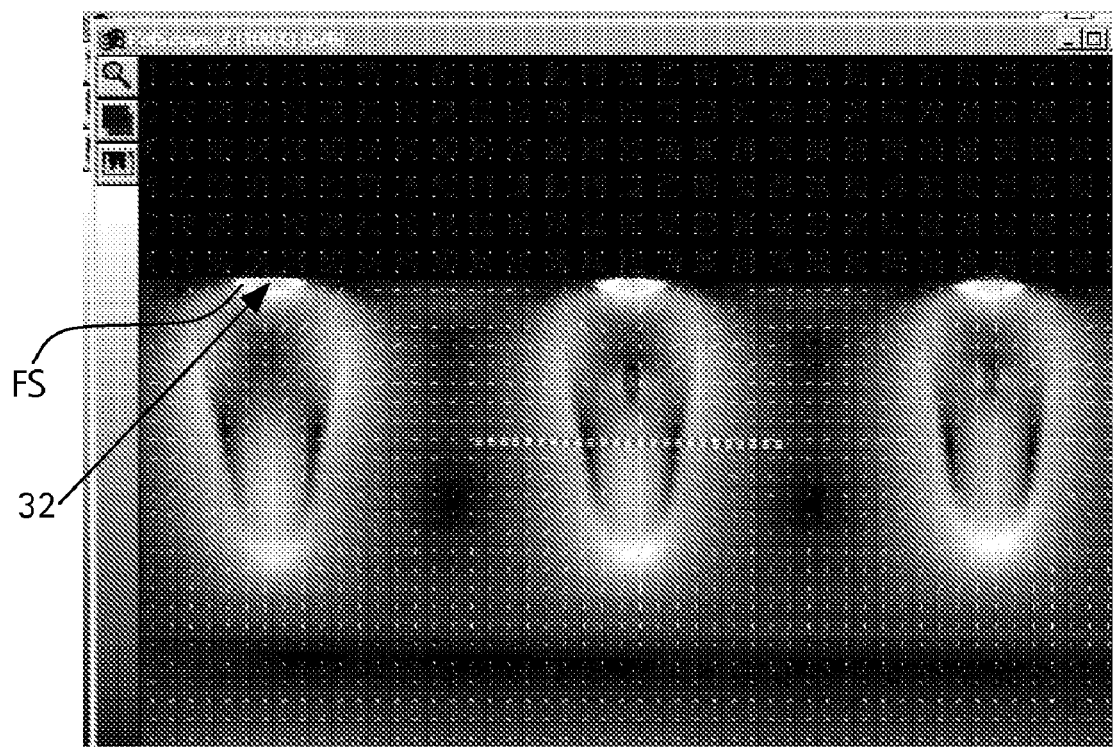
FIG. 4C illustrates birefringent areas and stress patterns of a cross-sectional area of a glass body after laser exposure.

FIG. 4C shows stress birefringence pattern for laser exposed and quenched (i.e., cooled) glass with the view taken perpendicular to the laser exposure (laser exposure comes from the top). The stress pattern shows depth of the laser affected area, which area will be preferentially etched in the etching step. The front surface FS is the surface irradiated by the laser.

The experiment (using translation velocities V of 5 mm/sec and 10 mm/sec) was then repeated, but with the Ce doped borosilocate glass body 30 partially annealed. That is, the glass body 30 of this example was heated above strain point and slowly cooled (10° C./min). This reduces stress, but not completely erases it, before the etching step. We have discovered that the annealing step resulted in a significant reduction in etch depth. The data (for velocities V mm/sec of 5 and 10 mm/sec) is summarized in Table 3.

TABLE 3

| V | Peak swell, µm | Birefringence nm, for 0.7 mm thick glass | Stress, psi | Etch dept (µm), sample annealed | Etch depth (µm), sample not annealed |
|---|---|---|---|---|---|
| 5 mm/s | 8.0 | 43.9 | 2853 | −40 | −58 |
| 10 mm/s | 3.25 | 22 | 1426 | −20 | −30 |

EXAMPLE 2

In this example, a glass body 30 was irradiated with a 3 W $CO_2$ laser 20, at two different locations. The composition of the glass body in this example was as follows:

| | (Mol %) |
|---|---|
| SiO2 | 81 |
| B2O3 | 13 |
| Al2O3 | 2 |

At both locations the laser output beam 22 was moved along the top surface of the glass body at a velocity V=5 mm/sec. The laser output beam 22 spot size was about 150 µm. The glass body was then cut in half, resulting in two identical glass samples, each containing one laser beam irradiated area. One of the glass samples was annealed prior to etching and another was not annealed prior to etching. As in the previous example, the etching step was performed with a HF acid. The resulting depression after etch was −8.7 µm deep for a glass sample that was not annealed, and for partially annealed glass the depression was −3 µm deep. Again, we observed that annealing reduced the depth of the etched depression. Thus, in order to achieve maximum depression depth (without additional reduction in velocity V, or increase in laser power) one should preferably not anneal the glass body between the steps of laser beam irradiation step and etching.

EXAMPLE 3

In this example, an iron-doped glass body 30 was irradiated with an 810 nm, CW laser 20, at two different locations. The composition of the glass body in this example was as follows:

| | (Mol %) |
|---|---|
| SiO2 | 82.28 |
| B2O3 | 8.13 |
| Al2O3 | 1.21 |
| Na2O | 5.38 |
| Fe2O3 | 1 |
| TiO2 | 2 |

The laser power and resulting birefringence of swells 40 are tabulated below in Table 4.

TABLE 4

Figure 5A:
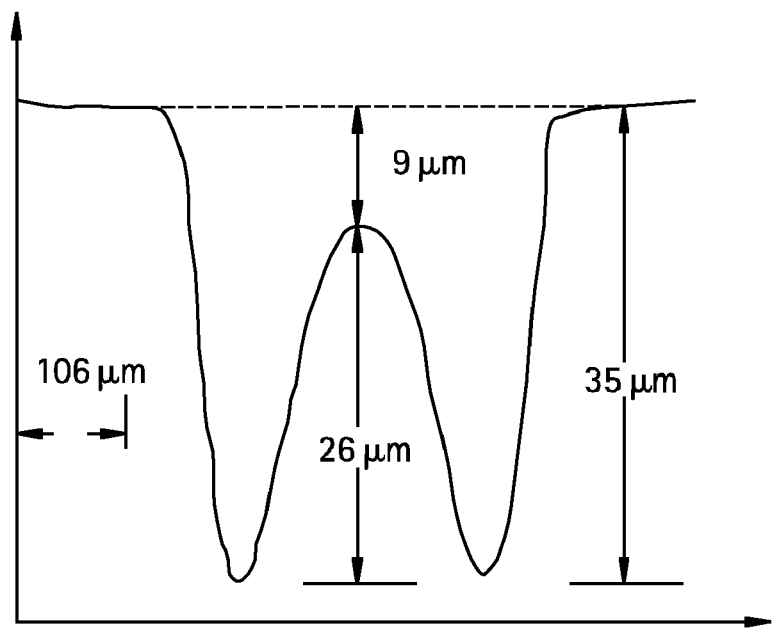
FIGS. 5A, 5C and 5E illustration of cross-sectional area of iron doped glass after production of laser induced swells and subsequent etching, without an annealing step therebetween.
Figure 5B:
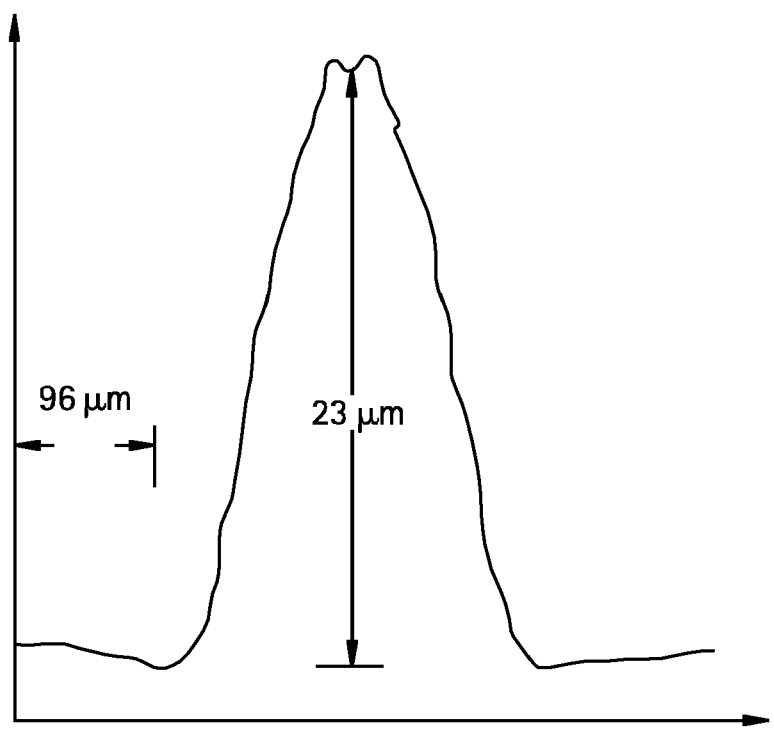
FIGS. 5B, 5D and 5F illustrates cross-sectional area of a glass body, after production of laser induced swells and the subsequent etching step, but with an annealing step therebetween. These figures show that in these glass samples no pits were produced in glass samples that underwent annealing before etching.
Figure 5C:
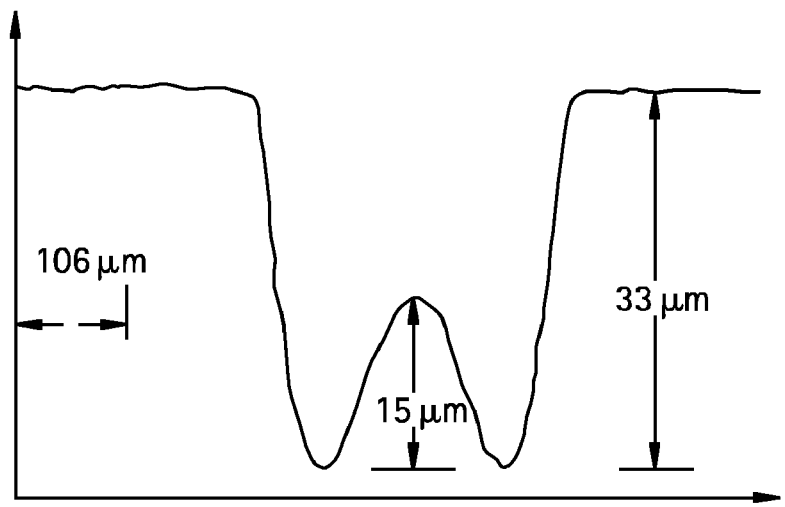
Figure 5D:
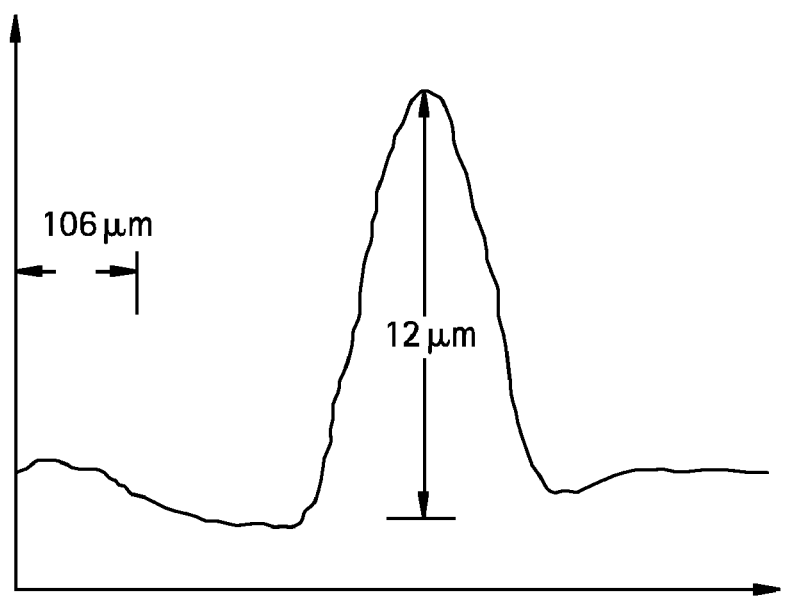
Figure 5E:
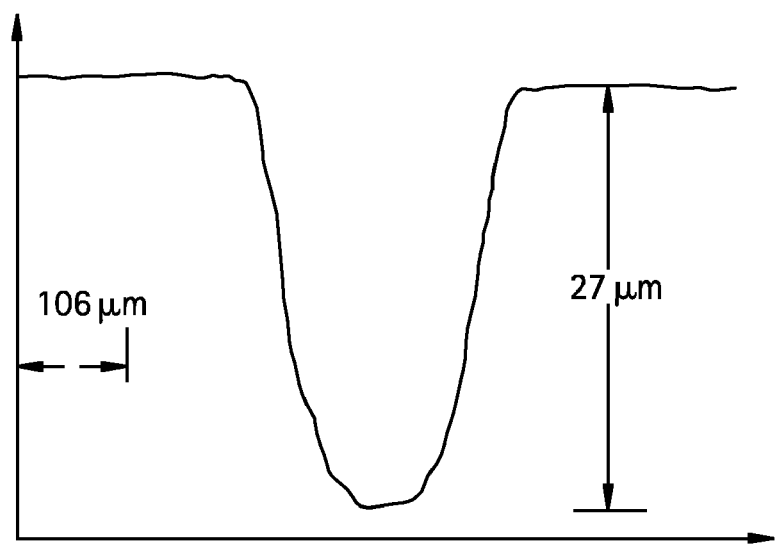
Figure 5F:
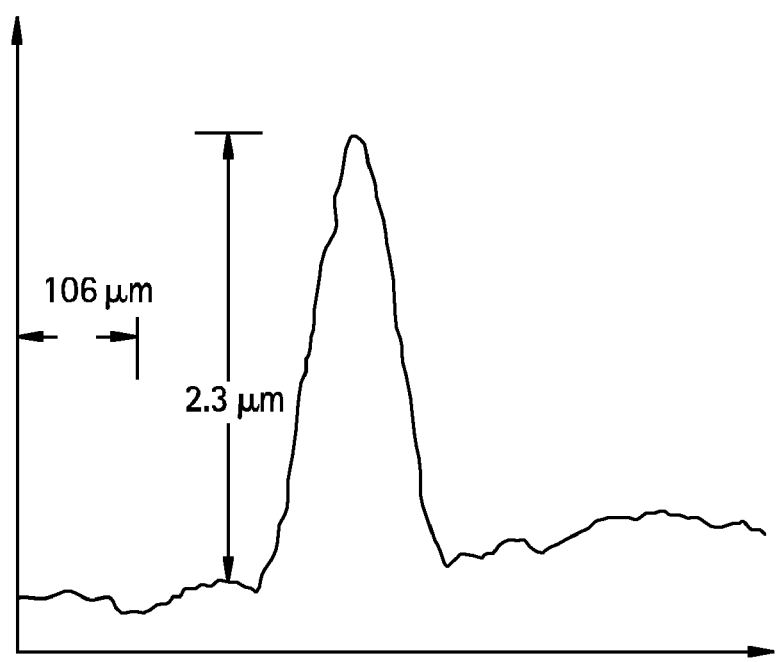

| | Corresponding figure | | | | | |
|---|---|---|---|---|---|---|
| | FIG. 5a | FIG. 5b | FIG. 5c | FIG. 5d | FIG. 5e | FIG. 5f |
| power W | 14 | 14 | 12 | 12 | 8 | 8 |
| stress, psi | 18,140 | 0 | 9783 | 0 | 5300 | 0 |
| Birefringence, nm for 0.7 mm glass | 279.4 | 0 | 150.7 | 0 | 81.6 | 0 |
| Sample annealed | no | yes | no | yes | no | yes |
| 50% HF/5 min | yes | yes | yes | yes | yes | yes |
| etched depth um | −35 | 23 | −33 | 12 | −27 | 2.3 |
| center bump in etch cavity | 26 | | 15 | | | |

In Table 4 the negative number corresponding to the etch depth means that the etched hole or groove is below the surface of the glass. Positive etch depth corresponds to the (at least partially) annealed examples, which indicate that no depression was formed by the etching process. In some glass bodies, the grove or hole contained a central "bump"—i.e., a raised area in the center and its height h' (shown in the last line of table 4) was measured relative to the deepest etched area of the glass body. For example (see FIG. 5a), an etched depth of −35 µm and a central bump height of 23 µm indicate that the etched area has a "w shaped" cross-section, with the deepest measured portions being 35 µm below the top surface of the glass body, and that the top of the "central bump" situated within the etched area is 26 µm above the lowest point, or 9 µm below the top surface of the glass body. For example, positive etch depth of 23 depth µm (see FIG. 5b) indicates that no depression was formed by the etching process because of annealing, and that the laser exposed area retained a swell that is 23 µm high.

The laser output beam 22 was moved along the top surface of the glass body at a velocity V=10 mm/sec. The laser output beam 22 spot size was about 600 µm. The glass body was then cut in half, resulting in two identical glass samples, each containing three laser beam irradiated areas corresponding to three swells 40, with each swell produced by a different beam intensity. One of the glass samples was annealed prior to etching and another was not annealed prior to etching. As in the previous example, the etching step was performed with a HF acid. The depths of resulting depression after the etch are tabulated in Table 4, both for the glass sample that was not annealed, and for glass sample that was partially annealed (i,e., stress was not completely removed). We observed that annealing interfered with etching and the annealed sample formed no depressions. We also observed that higher laser power corresponded to deeper pit formations. This suggests that stress plays an important role in formation of these features.

In the case with the iron doped glasses, corresponding to FIGS. 5A-5F, we observed an additional effect. The stress is not only relegated to the surface that directly sees the laser irradiation, but can be transferred to the rear surface, if the power density is sufficient (i.e., the power density is such that the laser energy can radiate to the rear surface). The amount of power required to heat the glass (e.g., at the rear surface) is related to reduction of the optical density of the glass during radiation, in this example due to changing of oxidation states of the Fe ions. This is due to the fact that that during cooling, Fe ions convert from an absorbing oxidation state to a non-absorbing oxidation state for 810 nm laser wavelength.

Figure 6:
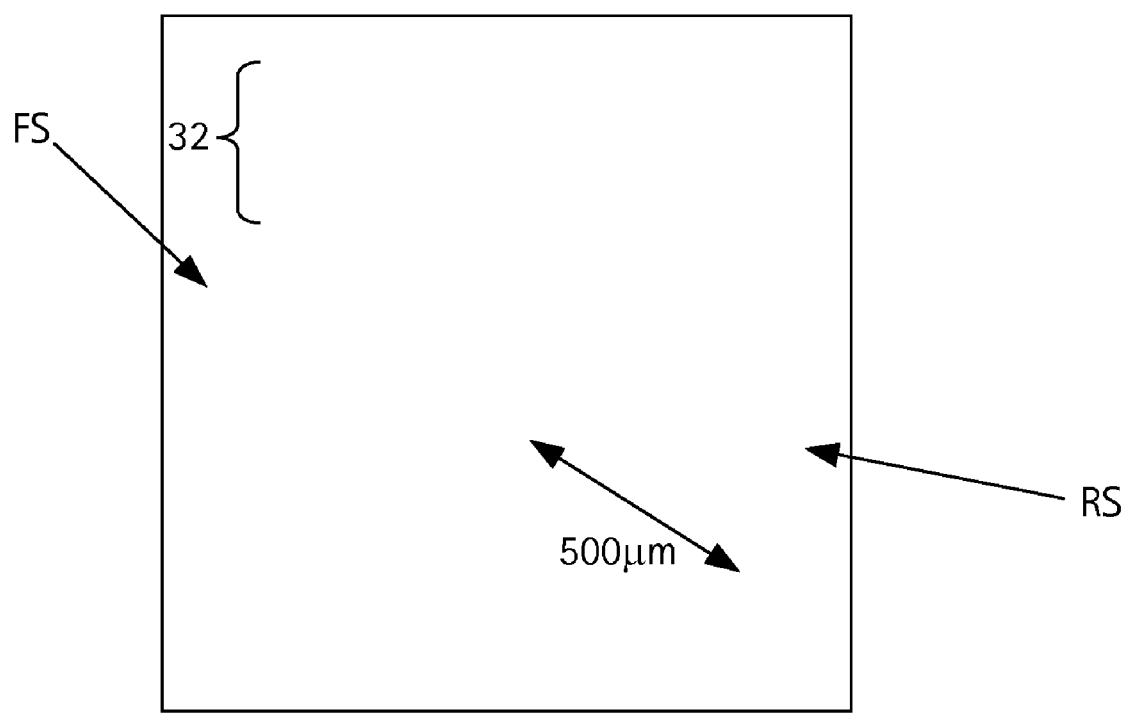
FIG. 6 is a photograph of exemplary etched iron doped glass body.

As seen in the cross section (FIG. 6), the etch rate in Fe doped glass is much more pronounced than in other glasses. This is due to deeper penetration of the heating zone into the glass. Since the glass becomes transparent during exposure, the stress is formed all the way through to the back surface. As with other glasses, we discovered that the etch rate was greatly reduced if the samples received an annealing step before HF acid etch. FIG. 6 is a photograph of exemplary etched iron doped glass body. Only the front surface of this glass body was irradiated, but both the front and the rear surfaces were exposed to acid (50% HF/5 min) simultaneously, i.e., both surfaces were etched simultaneously. FIG. 6 illustrates that in this glass body both the front surface FS and the rear surface RS have been etched and that the etched area is deeper on the rear surface RS. This is because laser induced stress was transferred from the laser exposed area(s) on the front surface to the rear surface of the glass body, and the rear surface experienced greater stress than the front surface. Table 5 shows the relationship between laser power during exposure, formed stress, and depth of etching by HF.

TABLE 5

| Iron doped glass | | | | | | | | | |
|---|---|---|---|---|---|---|---|---|---|
| | power W | | | | | | | | |
| | 2 | 6 | 12 | 15 | 22 | 18 | 15 | 22 | 18 |
| stress psi | 1630 | 7540 | 12,640 | 19,974 | 23,640 | 23,640 | 19,974 | 23,643 | 23,643 |
| Birefringence, nm for 0.7 mm glass | 25.1 | 116.1 | 194.6 | 307.6 | 364 | 364 | 307.6 | 364.1 | 364.1 |
| Sample annealed | no | no | no | No | no | no | no | no | no |
| 50% HF/5 min | yes | yes | yes | Yes | yes | yes | yes | yes | yes |
| etched depth um | 27 | 31 | 31 | 30 | 30 | 30 | 162 | 162 | 162 |
| center bump in etch cavity | | 12 | 28 | 36 | 55 | 45 | | | |
| surface measured | front | front | front | Front | front | front | rear | rear | rear |

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A method for laser patterning a partial depth surface portion of a glass body, said method comprising:
   providing a laser, said laser having a laser output beam at a laser wavelength $\lambda$;
   providing a glass body having an optical density at of at least 1.5 per cm at said wavelength $\lambda$;
   directing said laser output beam along an impinged path on the surface portion of said glass body to form a swell in said surface portion of said glass body by heating said surface portion of said glass body;
   cooling said heated surface portion of said glass body; and
   etching said surface portion of said glass body, wherein
      said surface portion of said glass body is heated to a target temperature T above a strain point of said glass body at a heating rate HR to form said swell along said impinged path of said laser output beam,
      said heating rate HR is a function of a target temperature T and an exposure time of said laser output beam along said impinged path and is controlled such that an exposure time required to reach a target temperature above a softening point of said glass does not require a power density that would lead to laser ablation of said surface portion of said glass body along said impinged path,
      said surface portion of said glass body is cooled to a temperature below said strain point of said glass body to induce regions of localized stress of at least 300 psi in said unablated surface portion of said glass body along said impinged path of said laser output beam and create a pattern of localized laser-induced stress in said glass body,
      said regions of induced localized stress penetrate said glass body below said surface portion of said glass body and have larger dimensions than the swell formed in said surface portion of said glass body along the path of the laser output beam, and
      said unablated surface portion is etched in said state of induced localized stress to form a patterned glass body.

2. The method for laser patterning a partial depth surface portion of a glass body according to claim 1, wherein said target temperature T is greater than 800° C.

3. The method for laser patterning a partial depth surface portion of said glass body of claim 1, wherein said impinged path on the surface portion of said glass body is heated at a rate between 500° C./sec to 5000° C./sec.

4. The method for laser patterning a partial depth surface portion of a glass body of claim 1 wherein said heated surface portion is cooled at a rate of 15000° C./sec to 100000° C./sec.

5. The method for laser patterning a partial depth surface portion of a glass body of claim 1, wherein said surface portion of said glass body is cooled to induce regions of localized stress in a range of 400 psi to 15000 psi.

6. The method for laser patterning a partial depth surface portion of a glass body of claim 1, wherein the glass body is not annealed between said directing step and said etching step.

7. The method for laser patterning a partial depth surface portion of a glass body of claim 1, wherein said laser is a continuous wave laser, a quasi CW laser with a repetition rate greater than 1 kHz, a diode laser, a Nd:Yag laser, or a $CO_2$ laser.

8. The method for laser patterning a partial depth surface portion of a glass body of claim 1, wherein said laser is a single pulse laser.

9. The method for laser patterning a partial depth surface portion of a glass body of claim 1, wherein said exposure time is greater than 50 milliseconds.

10. The method for laser patterning a partial depth surface portion of a glass body according to claim 1, said method further comprises:
   providing a laser output focusing lens for focusing said laser output beam; and
   directing said laser output beam through said focusing lens to produce a focused laser output beam proximate said glass body so as to expose and heat said glass body along said impinged path on said surface portion of said glass body proximate to said focused laser output.

11. The method for laser patterning a partial depth surface portion of a glass body according to claim 1, wherein said laser output beam is directed along said impinged path at a rate of at least 1 mm/sec.

12. The method for laser patterning a partial depth surface portion of a glass body according to claim 11, wherein said laser output beam is directed along said impinged path at a rate of 1 to 20 mm/sec.

13. The method for laser patterning a partial depth surface portion of a glass body according to claim 1, wherein said heating and cooling induce stress that is sufficient to cause said pattern of localized laser induced stress to etch at a faster etching rate than the area around said swell.

14. The method for laser patterning a partial depth surface portion of a glass body according to claim 13, wherein said heating and cooling induce stress that is sufficient to cause said pattern of localized laser induced stress to etch at least 10 times faster than an area around said swell.

15. The method for laser patterning a partial depth surface portion of a glass body according to claim 13, wherein said heating and cooling induce stress that is sufficient to cause said pattern of localized laser induced stress to etch at a rate of at least 5 mm/min.

16. A method for laser patterning a partial depth surface portion of a glass body, said method comprising:
   providing a pulse laser, said laser having a laser output beam at a laser wavelength $\lambda$, wherein 266 nm<$\lambda$<10 µm and said pulse laser has a repetition rate of more than 1 kHz;
   providing a glass body being doped with boron, iron, cerium, copper, vandium, or other transition metals having an optical density at of at least 2 per cm;
   directing said laser output beam along an impinged path on the surface portion of said glass body to form a swell in said surface portion of said glass body by heating said surface portion of said glass body, wherein
      said laser output beam is directed along said impinged path at a rate of at least 1 mm/sec,
      a laser output focusing lens for focusing said laser output beam to heat said surface portion of said glass body,
      said surface portion of said glass body is heated to a target temperature T above a strain point of said glass body at a heating rate HR to form a swell in said surface portion of said glass body along said impinged path of said laser output beam,
      said heating rate HR is a function of a target temperature T and an exposure time of said laser output beam along said impinged path and is controlled such that an exposure time required to reach a target temperature above a softening point of said glass does not require a power density that would lead to laser ablation of said surface portion of said glass body along said impinged path,
      said target temperature T>800° C., and
      said impinged path on the surface portion of said glass body is heated at a rate between 500° C./sec to 5000° C./sec;
   cooling said heated surface portion of said glass body, wherein
      said surface portion of said glass body is cooled to a temperature below said strain point of said glass body to induce regions of localized stress of at least 300 psi in said unablated surface portion of said glass body along said impinged path of said laser output beam and create a pattern of localized laser-induced stress in said glass body, and
      said heated surface portion is cooled at a rate of 15000° C./sec to 100000° C./sec; and
   etching said surface portion of said glass body, wherein
      said regions of induced localized stress penetrate said glass body below said surface portion of said glass body and have larger dimensions than the swell formed in said surface portion of said glass body along the path of the laser output beam,
      said unablated surface portion is etched in said state of induced localized stress to form a patterned glass body,
      said HR and cooling induce stress that is sufficient to cause said pattern of localized laser induced stress, etches at a faster etching rate than the area around said swell, and
      said regions of induced localized stress have a stress level in a range of 400 psi to 15000 psi.

* * * * *